United States Patent
Feng et al.

(10) Patent No.: US 11,366,549 B2
(45) Date of Patent: Jun. 21, 2022

(54) CAPACITANCE DETECTION APPARATUS AND ELECTRONIC DEVICE

(71) Applicant: SHENZHEN GOODIX TECHNOLOGY CO., LTD., Shenzhen (CN)

(72) Inventors: Lin Feng, Shenzhen (CN); Wangwang Yang, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 17/137,641

(22) Filed: Dec. 30, 2020

(65) Prior Publication Data
US 2021/0397293 A1    Dec. 23, 2021

(30) Foreign Application Priority Data
Jun. 23, 2020   (CN) .......................... 202021181498.3

(51) Int. Cl.
*G06F 3/041* (2006.01)
*G06F 3/044* (2006.01)

(52) U.S. Cl.
CPC .......... *G06F 3/0418* (2013.01); *G06F 3/0443* (2019.05)

(58) Field of Classification Search
CPC ...... G06F 3/0418; G06F 3/0443; G06F 3/044; G06F 3/041
See application file for complete search history.

(56) References Cited

U.S. PATENT DOCUMENTS

| | | | |
|---|---|---|---|
| 7,932,898 B2 | 4/2011 | Philipp et al. | |
| 8,115,499 B2 | 2/2012 | Osoinach et al. | |
| 9,250,751 B2 | 2/2016 | Philipp et al. | |
| 10,534,466 B2 | 1/2020 | Kim et al. | |
| 2007/0062739 A1 | 3/2007 | Philipp et al. | |
| 2010/0295559 A1 | 11/2010 | Osoinach | |
| 2011/0018560 A1* | 1/2011 | Kurashima | G06F 3/0445 324/679 |
| 2011/0182458 A1* | 7/2011 | Rosener | G06V 40/1306 381/384 |
| 2011/0199333 A1 | 8/2011 | Philipp et al. | |
| 2012/0044013 A1* | 2/2012 | Muranaka | G06F 3/0443 327/517 |
| 2012/0217982 A1* | 8/2012 | Narayanasamy | G01D 5/2405 324/686 |

(Continued)

FOREIGN PATENT DOCUMENTS

| | | |
|---|---|---|
| CN | 102439539 A | 5/2012 |
| CN | 102980715 A | 3/2013 |

(Continued)

*Primary Examiner* — Md Saiful A Siddiqui

(57) ABSTRACT

Provided are a capacitance detection apparatus and an electronic device. The capacitance detection apparatus includes: a chip; and a detection electrode layer, where the detection electrode layer is integrally disposed with the chip and electrically connected to the chip, the detection electrode layer includes at least one detection electrode configured to form at least one capacitance detection channel, the at least one capacitance detection channel is respectively configured to output at least one capacitance detection signal, and the chip is configured to process the at least one capacitance detection signal.

15 Claims, 10 Drawing Sheets

(56) References Cited

U.S. PATENT DOCUMENTS

| | | | | |
|---|---|---|---|---|
| 2012/0299851 | A1* | 11/2012 | Homma | G06F 3/0488 |
| | | | | 345/173 |
| 2013/0055558 | A1* | 3/2013 | Kim | G06F 3/0445 |
| | | | | 29/622 |
| 2014/0015595 | A1 | 1/2014 | Van Ausdall et al. | |
| 2015/0145537 | A1 | 5/2015 | Flanagan | |
| 2015/0146944 | A1* | 5/2015 | Pi | G06V 40/1318 |
| | | | | 382/124 |
| 2015/0268758 | A1* | 9/2015 | Lo | G06F 3/04166 |
| | | | | 345/174 |
| 2015/0293625 | A1 | 10/2015 | Narayanasamy et al. | |
| 2015/0338989 | A1 | 11/2015 | Noto | |
| 2016/0173185 | A1* | 6/2016 | Kang | H04B 7/0834 |
| | | | | 375/267 |
| 2016/0334914 | A1 | 11/2016 | Kim et al. | |
| 2017/0255297 | A1 | 9/2017 | Narayanasamy et al. | |
| 2020/0045422 | A1* | 2/2020 | Chiang | H04W 4/80 |
| 2020/0100010 | A1 | 3/2020 | Yang et al. | |
| 2020/0100013 | A1* | 3/2020 | Harjee | H04R 1/1091 |
| 2020/0314527 | A1 | 10/2020 | Guo et al. | |

FOREIGN PATENT DOCUMENTS

| | | |
|---|---|---|
| CN | 106155407 A | 11/2016 |
| CN | 107479716 A | 12/2017 |
| CN | 209134600 U | 7/2019 |
| CN | 110114738 A | 8/2019 |
| CN | 210324142 U | 4/2020 |
| JP | 2008225648 A | 9/2008 |
| JP | 2012043275 A | 3/2012 |
| KR | 20160048639 A | 5/2016 |
| WO | WO2009054592 A1 | 4/2009 |

\* cited by examiner

CAPACITANCE DETECTION APPARATUS AND ELECTRONIC DEVICE

CROSS-REFERENCE TO RELATED APPLICATION

This application claims priority to Chinese Patent Application No. 202021181498.3, filed on Jun. 23, 2020, which is hereby incorporated by reference in its entirety.

TECHNICAL FIELD

Embodiments of the present disclosure relate to the field of electronics, and more particularly, to a capacitance detection apparatus and an electronic device.

BACKGROUND

Wearing detection and touch functions have become basic functions of a wireless earphone.

At present, wearing detection mainly adopts an optics-based detection solution and a capacitance detection solution, and touch control is primarily a capacitance-based solution.

For an optical wearing detection solution, as shown in FIG. 1 and FIG. 2, a detection apparatus 100 includes an infrared light emitting unit 110 and a light receiving unit 120. The infrared light emitting unit 110 emits an infrared light signal, and the light receiving unit 120 performs wearing detection based on the received infrared light signal. In addition, the detection apparatus 100 also needs to add a filter and open a hole on a surface of an earphone as a light path, which is not conducive to a waterproof design of the earphone. Besides, an optical device generally has high power consumption. Moreover, if it is desired to support wearing detection and touch operation functions (such as a click, a double click, a slide and other gesture operations) on an electronic device such as an earphone, at least two chips are required. One chip is used for processing in optics-based wearing detection, and the other chip is used for processing in a capacitance-based touch operation, so the corresponding cost is relatively high. For a capacitive wearing detection solution, it is necessary to attach a detection electrode on an inner surface of the corresponding position of an earphone housing, which is susceptible to environmental interference from a circuit, water and sweat, temperature and humidity, etc., and thus leads to low detection accuracy. Furthermore, the above solutions of the prior art have high requirements on the assembly of a detection electrode, which affects production efficiency and has low yield.

SUMMARY

Provided are a capacitance detection apparatus and an electronic device, which can reduce environmental interference on the capacitance detection apparatus, accordingly, can improve detection accuracy of the capacitance detection apparatus, and further, can improve production efficiency and yield of the capacitance detection apparatus, and reduce costs of the capacitance detection apparatus and the electronic device.

In the first aspect, provided is a capacitance detection apparatus, where the capacitance detection apparatus is applied to an electronic device and comprises:

a chip;

a detection electrode layer, where the detection electrode layer is integrally disposed with the chip and electrically connected to the chip, the detection electrode layer includes at least one detection electrode configured to form at least one capacitance detection channel, the at least one capacitance detection channel is respectively configured to output at least one capacitance detection signal, and the chip is configured to process the at least one capacitance detection signal.

By integrally disposing the chip and the detection electrode layer, a hole on a surface of the electronic device is avoided to be opened, and further, the capacitance detection apparatus and the electronic device are protected from environmental interference from a circuit, water and sweat, temperature and humidity, etc., which is beneficial to a waterproof design of the capacitance detection apparatus and the electronic device. Accordingly, detection accuracy of the capacitance detection apparatus and the electronic device can be improved. In addition, there is no need to add additional analog wiring in the electronic device to electrically connect the detection electrode on an inner wall of a housing of the electronic device with the capacitance detection apparatus inside the housing of the electronic device. Accordingly, an interference resistance ability of the capacitance detection apparatus can be improved. Moreover, the integrally disposed capacitance detection apparatus provided by the present disclosure can be disposed in the electronic device as a whole, which can reduce development (design) difficulty of an application circuit and a structural process of the capacitance detection apparatus, reduce an assembly procedure of the capacitance detection apparatus, reduce assembly difficulty and mass production difficulty of the capacitance detection apparatus, increase production efficiency and yield of the capacitance detection apparatus, and reduce costs of the capacitance detection apparatus and the electronic device. Further, the capacitance detection apparatus provided by the present disclosure can realize a wearing detection function and a touch function at the same time through one chip, or realize multiple signal detection functions based on capacitance through one chip, for example, functions such as wearing detection, touch control, as well as pressure detection based on capacitance are integrated on one chip, which can reduce cost of the electronic device.

In some possible implementation manners, the detection electrode layer is disposed on a surface of the chip.

By disposing the detection electrode layer on the surface of the chip, not only can the chip and the detection electrode layer be integrally disposed, but also a preparation process of the chip is avoided to be affected, which is equivalent to that the detection electrode layer can be integrated on chips of various specifications. Accordingly, practicability of the capacitance detection apparatus can be improved.

In addition, disposing the detection electrode layer on the surface of the chip can reduce difficulty of removing or repairing the detection electrode layer.

In some possible implementation manners, the detection electrode layer is disposed inside a circuit layer of the chip or on a surface of the circuit layer.

By disposing the detection electrode layer inside the circuit layer of the chip or on the surface of the circuit layer, not only can the chip and the detection electrode layer be integrally disposed, but also the detection electrode layer can be directly prepared in a process of preparing the chip, which avoids separately designing an integration process on the prepared chip. Accordingly, the integration process can be simplified.

In some possible implementation manners, the capacitance detection apparatus further includes:

a packaging layer, where the packaging layer is configured to package the chip to form a capacitance detection module, and the detection electrode layer is disposed inside the packaging layer or on a surface of the packaging layer.

By integrally disposing the detection electrode layer and the chip in a packaging process, not only can the chip and the detection electrode layer be integrally disposed, but also an integration process can be avoided to be separately designed on the prepared chip. Accordingly, the integration process can be simplified.

In addition, an integration position of the detection electrode layer can be adjusted adaptively for different packaging processes. Accordingly, practicability of the capacitance detection apparatus can be improved.

In some possible implementation manners, the detection electrode layer is an electroplating layer.

The detection electrode layer is designed as an electroplating layer, which is equivalent to that a preparation process of the detection electrode layer can be integrated into a preparation process or a packaging process of the chip, so that an integration process can be avoided to be separately designed for the capacitance detection electrode. Accordingly, the integration process can be simplified.

In some possible implementation manners, the detection electrode layer is connected to the chip through a conductive member.

The detection electrode layer is designed as an electroplating layer, which is equivalent to that the detection electrode layer can be integrated on chips of various specifications in a mounting and fixing manner. Accordingly, practicability of the capacitance detection apparatus can be improved.

In addition, difficulty of removing or repairing the detection electrode layer can be reduced.

In some possible implementation manners, the capacitance detection apparatus further includes:

a shielding electrode layer configured to output a signal with the same frequency, phase and amplitude as the at least one capacitance detection signal to form a shielding electric field, where the shielding electrode layer surrounds the detection electrode layer, and the shielding electric field is used to reduce the curvature of an induction line in an induced electric field generated by the at least one detection electrode.

The shielding electric field can not only play a role of active shielding, but also can suppress bending of the induction line at the edge position from the detection electrode layer, which increases an utilization rate of the induction line. Accordingly, detection accuracy is improved.

In some possible implementation manners, the shielding electrode layer and the detection electrode layer are located in the same plane.

By disposing the shielding electrode layer and the detection electrode layer in the same plane, not only can a shielding effect of the shielding electrode layer be ensured, but also the capacitance detection apparatus can be prevented from being too thick. Accordingly, it is beneficial to designing the capacitance detection apparatus in a thinner and lighter manner.

In some possible implementation manners, the capacitance detection apparatus further includes:

a reference electrode configured to compensate for temperature drift of the detection electrode layer and/or a temperature sensor configured to detect temperature, where the reference electrode is electrically connected to the chip, the temperature sensor is electrically connected to the reference electrode or/and the chip, and the temperature sensor is configured to trigger the reference electrode to compensate for the at least one capacitance detection signal, and the chip is configured to obtain the at least one capacitance detection signal and a compensation signal, and output a signal for indicating a detection result.

Through the reference electrode and/or the temperature sensor, it is possible to calibrate influence of a temperature change on induction precision, thereby achieving temperature drift suppression, and further reducing external interference on the capacitance detection apparatus and improving accuracy of the capacitance signal detected by the capacitance detection apparatus.

In some possible implementation manners, a connecting portion is provided at one end of the capacitance detection apparatus, and the connecting portion is configured to be connected to an external electrode provided on the outside of the capacitance detection apparatus in the electronic device.

In some possible implementation manners, a signal output by the external electrode is used for at least one of: wearing detection, in-box detection, proximity detection, human-computer interaction detection, or pressure detection.

By matching the external electrode with the detection electrode layer, not only can multiple detection functions be realized at the same time, but also various application scenarios can be applied. Accordingly, practicability of the electronic device can be improved.

In some possible implementation manners, the capacitance detection apparatus further includes:

a hub, where the chip is connected to a processor of the electronic device through the hub to realize communication between the capacitance detection apparatus and the electronic device.

Through the hub, the capacitance detection apparatus can support calculation and processing of a signal from other sensors on the basis of a wearing detection function and a human-computer interaction function, and report a processing result to a processor. Accordingly, occupation of resources of the processor can be reduced, and system power consumption is further reduced.

In some possible implementation manners, the capacitance detection apparatus further includes:

an encoding and decoding circuit, where the encoding and decoding circuit is connected to the at least one detection electrode, and the at least one detection electrode is configured to form a coupling capacitor with a coupling electrode at an opposite end, and the encoding and decoding circuit transmits an encoded signal to the opposite end or receives a signal to be decoded transmitted by the opposite end through the coupling capacitor.

By matching the encoding and decoding circuit with the at least one detection electrode, the electronic device where the capacitance detection apparatus is located can be enabled to communicate with the opposite end, and transmission efficiency and accuracy rate of the at least one capacitance detection signal can be ensured.

In some possible implementation manners, the at least one capacitance detection signal is used for at least one of:

wearing detection, in-box detection, proximity detection, human-computer interaction detection, or pressure detection.

Through the at least one capacitance detection signal, not only can wearing detection be performed, but also human-computer interaction can be performed, that is, the capacitance detection apparatus can be compatible with multiple functions such as a wearing detection function and a human-computer interaction function, which is equivalent to that multiple functions such as a wearing detection function and a human-computer interaction function can be realized through a single capacitance detection apparatus. Accordingly, the comprehensive cost of a system can be reduced.

In a second aspect, provided is an electronic device, including:

the capacitance detection apparatus described in the first aspect and any one of possible implementation manners of the first aspect.

In some possible implementation manners, an external electrode of the electronic device is an antenna of the electronic device, and a signal output by the external electrode is used for at least one of: wearing detection, in-box detection, proximity detection, human-computer interaction detection, or pressure detection.

The antenna in the electronic device is multiplexed as the external electrode to achieve various detection functions, which is equivalent to that the number of devices in the capacitance detection apparatus is reduced while an antenna function and various detection functions are ensured, and can effectively reduce cost and occupation space of the capacitance detection apparatus.

In addition, multiplexing the antenna as the external electrode can avoid the problem of interference between positions of the antenna and the external electrode. Accordingly, antenna efficiency and external detection performance of the electronic device can be ensured.

In some possible implementation manners, the electronic device is an earphone, and the earphone further includes:

a housing and a main board disposed in the housing, where the capacitance detection apparatus is disposed on an inner wall of the housing or the capacitance detection apparatus is disposed on the main board.

In some possible implementation manners, the capacitance detection apparatus is fixedly connected to an inner side surface of the housing or the main board through an adhesive layer.

By attaching the capacitance detection apparatus to the inner surface of the electronic device (such as an earphone) or placing it on the main board, the corresponding detection function can be realized, which avoids opening a hole on the surface of the electronic device, and further avoids environmental interference from a circuit, water and sweat, temperature and humidity, etc., and is beneficial to a waterproof design of the electronic device. Accordingly, detection accuracy can be improved.

In addition, addition of additional analog wiring is avoided. Accordingly, anti-interference ability of a system is effectively improved, development (design) difficulty of an application circuit and a structural process is reduced, mass production difficulty is reduced, and production efficiency is increased.

DESCRIPTION OF EMBODIMENTS

Technical solutions in embodiments of the present application will be described hereinafter with reference to the accompanying drawings.

Figure 1:
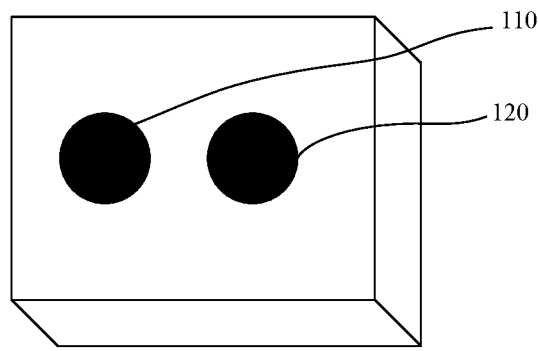
FIG. 1 and FIG. 2 are schematic structural diagrams of an optical wearing detection apparatus in the prior art.
Figure 2:
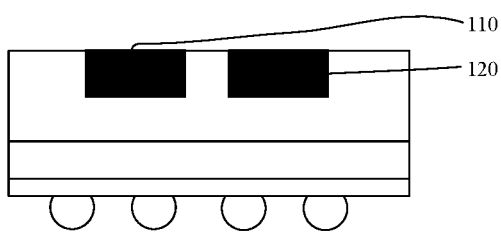
Figure 3:
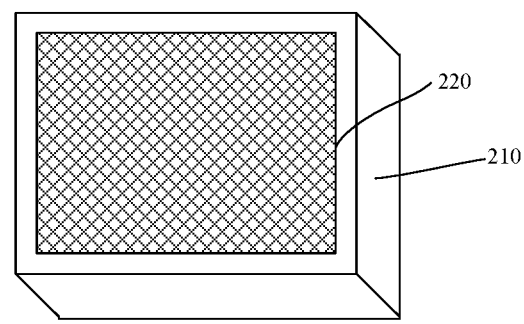
FIG. 3 is a schematic top view of a capacitance detection apparatus according to an embodiment of the present application.
Figure 4:
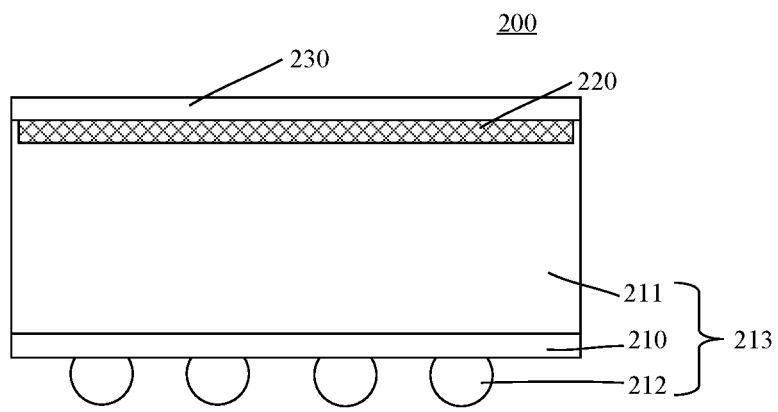
FIG. 4 is a schematic side cross-sectional view of a capacitance detection apparatus according to an embodiment of the present application.

FIG. 3 and FIG. 4 are respectively a schematic top view and a schematic side cross-sectional view of a capacitance detection apparatus 200 according to embodiments of the present application. It should be understood that the capacitance detection apparatus 200 may be applicable to an electronic device, and the electronic device includes a wearable device, including but not limited to a health bracelet, a watch, a charging box, a Bluetooth earphone, a wired earphone, a handheld device, etc. The electronic device may also include a portable device such as a touch switch, a proximity switch, an electronic cigarette, and a remote control. The capacitance detection apparatus 200 is compatible with a wearing detection function and a touch (a type of human-computer interaction) function.

As shown in FIG. 3 and FIG. 4, the capacitance detection apparatus 200 may include a chip 213 and a detection electrode layer 220, the detection electrode layer 220 and the chip 213 are integrally disposed, the detection electrode layer 220 includes at least one detection electrode configured to form at least one capacitance detection channel, the at least one capacitance detection channel is respectively configured to output at least one capacitance detection signal, and the chip 213 is configured to process the at least one capacitance detection signal.

By integrally disposing the chip and the detection electrode layer, a hole on a surface of the electronic device is avoided to be opened, and further, the capacitance detection apparatus 200 is protected from environmental interference from a circuit, water and sweat, temperature and humidity, etc., which is beneficial to a waterproof design of the capacitance detection apparatus 200. Accordingly, detection accuracy of the capacitance detection apparatus 200 can be improved.

In addition, there is no need to add additional analog wiring in the electronic device to electrically connect the detection electrode on an inner wall of a housing of the electronic device with the capacitance detection apparatus inside the housing of the electronic device. Accordingly, an interference resistance ability of the capacitance detection apparatus 200 can be improved. Moreover, the integrally disposed capacitance detection apparatus provided by the present disclosure can be disposed in the electronic device as a whole, which can reduce development (design) difficulty of an application circuit and a structural process of the capacitance detection apparatus 200, reduce an assembly procedure of the capacitance detection apparatus, reduce assembly difficulty and mass production difficulty of the capacitance detection apparatus 200, increase production efficiency and yield of the capacitance detection apparatus 200, and reduce cost of the electronic device. Further, the capacitance detection apparatus provided by the present disclosure can realize a wearing detection function and a touch function at the same time through one chip, or realize multiple signal detection functions based on capacitance through one chip, for example, functions such as wearing detection, touch control, as well as pressure detection based on capacitance are integrated on one chip, which can reduce cost of the electronic device.

It should be understood that integrally disposing the detection electrode layer 220 and the chip 213 in the embodiment of the present application can be understood as integrating the detection electrode layer 220 and the chip 213 to form a whole.

In some embodiments of the present application, the at least one capacitance detection signal is used for at least one of: wearing detection, in-box detection, proximity detection, human-computer interaction detection, or pressure detection. The human-computer interaction detection may be touch detection.

Through the at least one capacitance detection signal, not only can wearing detection be performed, but also human-computer interaction can be performed, that is, the capacitance detection apparatus can be compatible with multiple functions such as a wearing detection function and a human-computer interaction function, which is equivalent to that multiple functions such as a wearing detection function and a human-computer interaction function can be realized through a single capacitance detection apparatus. Accordingly, the comprehensive cost of a system can be reduced.

In some embodiments of the present application, the detection electrode layer 220 may be an electroplating layer, or the detection electrode layer 220 is connected to the chip 213 through a conductive member.

The detection electrode layer 220 is designed as an electroplating layer, which is equivalent to that a preparation process of the detection electrode layer 220 can be integrated into a preparation process or a packaging process of the chip 213, so that an integration process can be avoided to be separately designed for the detection electrode layer 220. Accordingly, the integration process can be simplified.

The detection electrode layer 220 is designed as an electroplating layer, which is equivalent to that the detection electrode layer 220 can be integrated on chips 213 of various specifications in a mounting and fixing manner. Accordingly, practicability of the capacitance detection apparatus 200 can be improved.

In addition, difficulty of removing or repairing the detection electrode layer 220 can be reduced.

In some embodiments of the present application, the minimum distance between the capacitance detection apparatus 200 and an object to be detected is greater than or equal to a preset threshold, so that detection accuracy of the at least one capacitance detection signal meets detection requirements of the capacitance detection apparatus 200. For example, the preset threshold may be 5 mm. Configuring the minimum distance between the capacitance detection apparatus 200 and the object to be detected to be greater than or equal to the preset threshold can protect a detection result from environmental interference from a circuit, water and sweat, temperature and humidity, etc., thereby improving the detection accuracy, and further, enabling the detection accuracy of the at least one capacitance detection signal to meet the detection requirements of the capacitance detection apparatus 200. In other words, integrally disposing the detection electrode layer 220 on the chip 213 can ensure that the minimum distance between the capacitance detection apparatus 200 and the object to be detected is greater than or equal to the preset threshold, and further, the detection accuracy of the at least one capacitance detection signal meets the detection requirements of the capacitance detection apparatus 200. Of course, the preset threshold of 5 mm is only an example, and the present application is not limited to this. For example, the preset threshold may also be a range value. For another example, the preset threshold may also be another specific value, for example, 1 mm.

In some embodiments of the present application, the detection electrode layer 220 is disposed on a surface of the chip 213. Alternatively, the detection electrode layer 220 is disposed inside a circuit layer of the chip 213 or on a surface of the circuit layer.

As shown in FIG. 4, the chip 213 includes a wafer 210 and a circuit layer 211, and the circuit layer 211 may be disposed on a surface of the wafer 210. The wafer 210 may also be referred to as a silicon wafer. The chip 213 may be a diced chip or a chip to be packaged.

As shown in FIG. 4, in some embodiments of the present application, the detection electrode layer 220 may be disposed on a surface of the circuit layer 211.

By disposing the detection electrode layer 220 on the surface of the chip 213, not only can the chip 213 and the detection electrode layer 220 be integrally disposed, but also a preparation process of the chip 213 is avoided to be affected, which is equivalent to that the chip 213 can adopt chips of various specifications. Accordingly, practicability of the capacitance detection apparatus 200 can be improved.

In addition, disposing the detection electrode layer 220 on the surface of the chip 213 can reduce difficulty of removing or repairing the detection electrode layer 220.

Of course, FIG. 4 is only an example of the present application and should not be construed as a limitation to the present application.

In other alternative embodiments, the detection electrode layer 220 is integrally disposed between the wafer 210 and the circuit layer 211 or inside the circuit layer 211.

By disposing the detection electrode layer 220 inside the circuit layer 211 of the chip 213 or on the surface of the circuit layer 211, not only can the chip 213 and the detection electrode layer 220 be integrally disposed, but also the detection electrode layer 220 can be directly prepared in a process of preparing the chip 213, which avoids separately designing an integration process on the prepared chip 213. Accordingly, the integration process can be simplified.

For example, the detection electrode layer 220 is an electroplating layer disposed on the surface of the chip 213. In other words, the detection electrode layer 220 may be electroplated to the chip 213. Optionally, the electroplating layer may be a circuit layer prepared in a preparation process. For another example, the detection electrode layer 220 is connected to the chip 213 through a conductive member. Optionally, the detection electrode layer 220 is fixed and mounted to the chip 213 through a conductive member. Optionally, the detection electrode layer 220 may be electroplated to a surface of the wafer 210, or the detection electrode layer 220 may be connected to a surface of the wafer 210 through a conductive member. For another example, the circuit layer 211 includes at least one circuit layer, the detection electrode layer 220 may be electroplated to a surface of any one of the at least one circuit layer, or the detection electrode layer 220 may be connected to any one of the at least one circuit layer through a conductive member.

As shown in FIG. 4, in some embodiments of the present application, the capacitance detection apparatus 200 further includes a packaging layer 230, and the packaging layer 230 is configured to package the chip 213 to form a capacitance detection module. The packaging layer 230 may be configured to protect and insulate the chip 213. Optionally, the detection electrode layer 220 is disposed inside the packaging layer 230 or on a surface of the packaging layer 230.

By integrally disposing the detection electrode layer 220 and the chip 213 in a packaging process, not only can the chip 213 and the detection electrode layer 220 be integrally disposed, but also an integration process can be avoided to be separately designed on the prepared chip 213. Accordingly, the integration process can be simplified.

In addition, an integration position of the detection electrode layer 220 can be adjusted adaptively for different packaging processes. Accordingly, practicability of the capacitance detection apparatus 200 can be improved.

As shown in FIG. 4, in some embodiments of the present application, the packaging layer 230 is configured to package the detection electrode layer 220 and the chip 213, so as to integrally dispose the detection electrode layer 220 and the chip 213.

In other words, the packaging layer 230 is disposed above the detection electrode layer 220 and the chip 213, so that the detection electrode layer 220 and the chip 213 serve as a whole in the form of a packaging body to integrally dispose the detection electrode layer 220 and the chip 213.

Of course, FIG. 4 is only an example of the present application and should not be construed as a limitation to the present application.

In other alternative embodiments, the detection electrode layer 220 may be integrally disposed on a surface of the capacitance detection module.

For example, the detection electrode layer 220 is an electroplating layer disposed on a surface of the capacitance detection module. Optionally, the electroplating layer may be a circuit layer prepared in a preparation process. For another example, the detection electrode layer 220 is connected to the capacitance detection module through a conductive member. Optionally, the detection electrode layer 220 is fixed and mounted to the capacitance detection module through a conductive member. In other words, the detection electrode layer 220 may be electroplated to the capacitance detection module, or the detection electrode layer 220 may be connected to the capacitance detection module through a conductive member. In other words, the chip 213 may be directly packaged with the packaging layer 230 to form a capacitance detection module, and then the detection electrode layer 220 is integrally disposed on the capacitance detection module.

Optionally, the detection electrode layer 220 may be electroplated to any surface of the capacitance detection module, or the detection electrode layer 220 is connected to the chip 213 in the capacitance detection module through a conductive member.

As shown in FIG. 4, in some embodiments of the present application, the chip 213 may further include at least one pad 212, and the at least one pad 212 may be configured to be connected to an external device or an internal device of the capacitance detection apparatus.

For example, some of the at least one pad 212 may be configured to be connected to a processor of an electronic device in which the capacitance detection apparatus 200 is mounted. For another example, some of the at least one pad 212 may be configured to be connected to the detection electrode layer 220.

It should be noted that the embodiment of the present application does not limit the shape and preparation method of the detection electrode layer 220 (that is, the at least one detection electrode). For example, the shape of each of the at least one detection electrode may be a square, a circle or any shape. For example, a metal film may be attached to a surface of a metal or other material part by means of electrolysis, and the metal film may serve as the detection electrode layer 220. For another example, the detection electrode layer 220 may be integrated on a surface of the wafer 210, inside the circuit layer 211, or a surface of the circuit layer 211 by using a redistribution layer (RDL) or other technologies. The wafer may be a substrate (also called a base substrate) for manufacturing a semiconductor transistor or an integrated circuit, for example, a silicon wafer.

In addition, the embodiment of the present application does not limit the specific integration position of the detection electrode layer 220.

Figure 5:
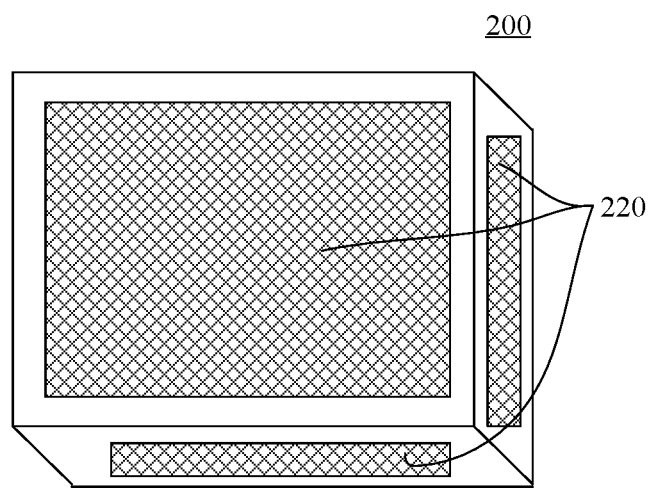
FIG. 5 and FIG. 6 are schematic diagrams of positions of a detection electrode layer in a capacitance detection apparatus according to embodiments of the present application.
Figure 6:
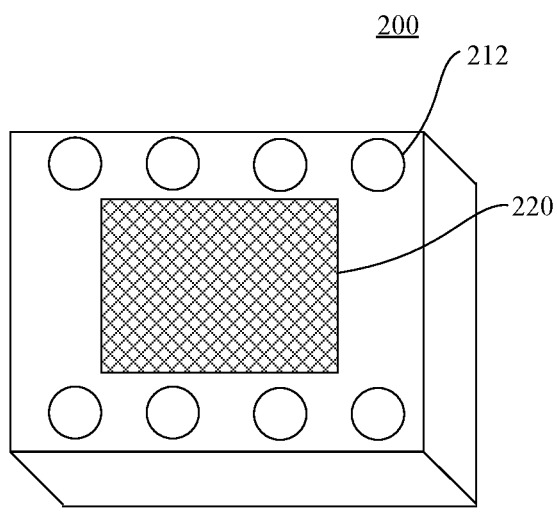

FIG. 5 and FIG. 6 are exemplary diagrams of specific positions of a detection electrode layer 220 according to embodiments of the present application.

As shown in FIG. 5, in some embodiments of the present application, the detection electrode layer 220 may be disposed on a top surface and/or a side surface of the chip or module, and the side surface may be a surface where a pad is not disposed.

As shown in FIG. 6, in some embodiments of the present application, the detection electrode layer 220 may be integrally disposed on a bottom surface of the chip or module, and the bottom surface may be a surface where a pad is disposed.

Based on this, the embodiment of the present application also does not specifically limit the mounting position of the capacitance detection apparatus 200.

Figure 7:
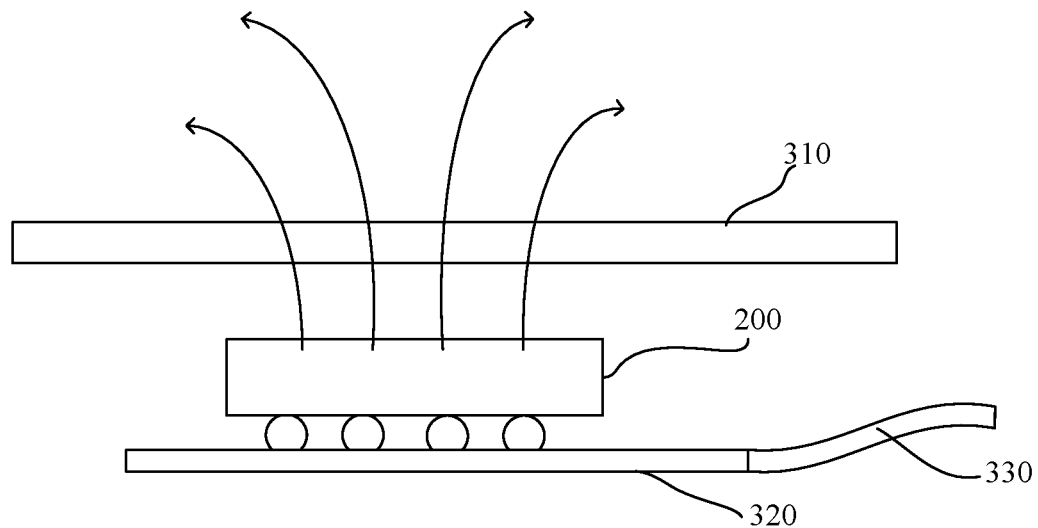
FIG. 7 and FIG. 8 are schematic structural diagrams of positions between a capacitance detection apparatus and a housing of an earphone according to embodiments of the present application.
Figure 8:
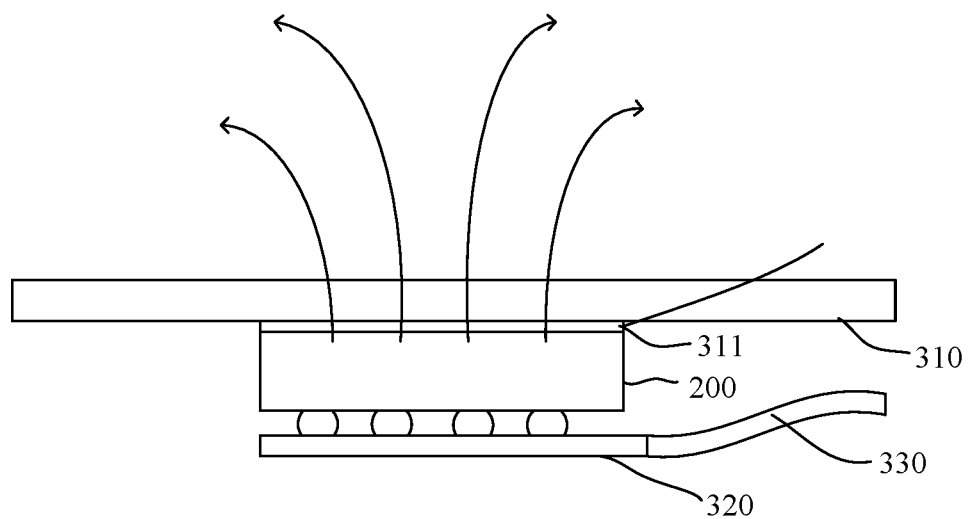

FIG. 7 and FIG. 8 are exemplary diagrams of specific mounting positions of the capacitance detection apparatus 200 according to embodiments of the present application.

As shown in FIG. 7, in some embodiments of the present application, the capacitance detection apparatus 200 may have a certain distance from a housing 310 of an electronic device, that is, the capacitance detection apparatus 200 may be decoupled from the housing 310. For example, the capacitance detection apparatus 200 may be fixed and mounted on an internal device of an electronic device, so that the capacitance detection apparatus 200 and the housing 310 are kept at a certain distance.

As shown in FIG. 8, in some embodiments of the present application, the capacitance detection apparatus 200 may also be directly attached to the housing 310 through an adhesive layer 311, so that the capacitance detection apparatus can be easily and quickly mounted on an electronic device to which it belongs, and mounting cost is relatively low.

Figure 9:
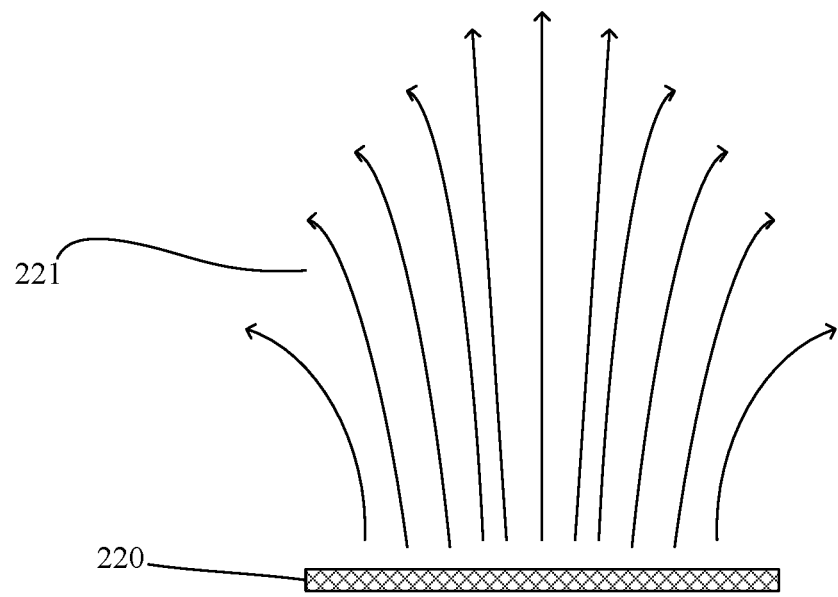
FIG. 9 is a schematic distribution diagram of induction lines of a detection electrode layer of the capacitance detection apparatus shown in FIG. 4.

FIG. 9 is a distribution diagram of induction lines of the detection electrode layer 220 of the capacitance detection apparatus 200 shown in FIG. 4.

As shown in FIG. 9, induction lines of the detection electrode layer 220 in the capacitance detection apparatus 200 are affected by an edge effect. Compared with induction lines close to the center of the detection electrode layer 220, induction lines close to the edge of the detection electrode layer 220 are bent to both sides of the detection electrode layer 220 to a greater extent.

In other words, the detection electrode layer 220 has a larger detection angle, which reduces detection effect of the detection electrode layer 220.

Figure 10:
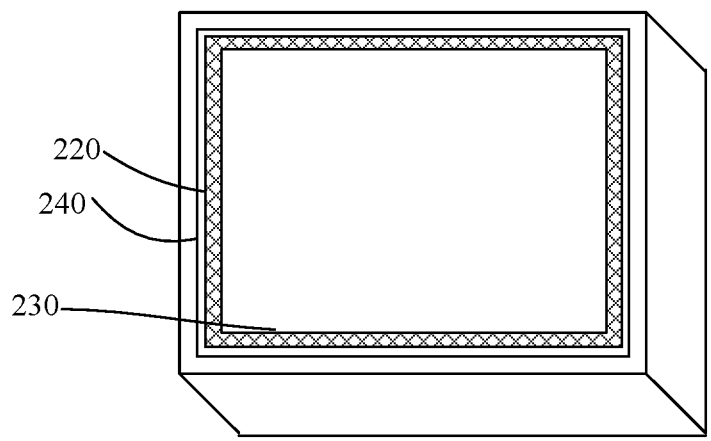
FIG. 10 is a schematic structural diagram of a capacitance detection apparatus having a shielding electrode layer according to an embodiment of the present application.
Figure 11:
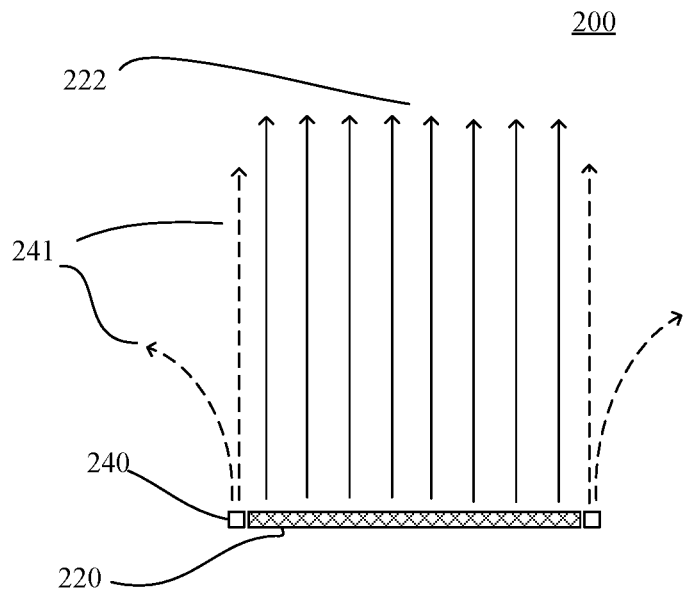
FIG. 11 is a schematic distribution diagram of induction lines of a detection electrode layer of the capacitance detection apparatus in FIG. 10.

FIG. 10 is a schematic structural diagram of a capacitance detection apparatus having a shielding electrode layer according to an embodiment of the present application. FIG. 11 is a schematic distribution diagram of induction lines of a detection electrode layer of the capacitance detection apparatus in FIG. 10.

As shown in FIG. 10, in some embodiments of the present application, the capacitance detection apparatus 200 may further include a shielding electrode layer 240. The shielding electrode layer 240 is disposed in a peripheral region of the detection electrode layer 220. The shielding electrode layer 240 is configured to output a signal with the same frequency, phase and amplitude as the at least one capacitance detection signal to form a shielding electric field, and the shielding electric field is used to reduce the curvature of an induction line in an induced electric field generated by the at least one detection electrode.

Optionally, the shielding electrode layer 240 and the detection electrode layer 220 are located in the same plane to reduce the thickness of the capacitance detection apparatus 200.

By disposing the shielding electrode layer 240 and the detection electrode layer 220 in the same plane, not only can a shielding effect of the shielding electrode layer 240 be ensured, but also the capacitance detection apparatus 200 can be prevented from being too thick. Accordingly, it is beneficial to designing the capacitance detection apparatus 200 in a thinner and lighter manner.

As shown in FIG. 11, since the shielding electrode layer 240 outputs a signal with the same frequency, phase and amplitude as the detection electrode layer 220 does, that is, the shielding electrode layer 240 can be equivalent to an edge of the detection electrode layer 220, an induction line of the detection electrode layer 220 can be suppressed from spreading to the edge, thereby achieving an effect of converging an electric field, and making a detection direction of the detection electrode layer 220 more concentrated. Accordingly, detection accuracy can be improved.

In other words, the shielding electrode layer 240 can not only play a role of active shielding, but also can suppress bending of the induction line at the edge position from the detection electrode layer 220, which increases an utilization rate of the induction line, and improves detection accuracy.

In some embodiments of the present application, the chip 213 is configured to obtain the at least one capacitance detection signal and a compensation signal, and remove external interference according to the capacitance detection signal and the compensation signal to output a signal for indicating a detection result more accurately, where the compensation signal is used to reduce the influence of an external factor on the detection result.

The external factor includes but is not limited to factors such as temperature, humidity, and external magnetic field.

For example, the chip 213 may obtain the compensation signal, and receive the at least one capacitance detection signal output by the detection electrode layer 220, and output a signal for indicating a detection result by combining the compensation signal and the capacitance detection signal and a temperature drift suppression algorithm.

Figure 12:
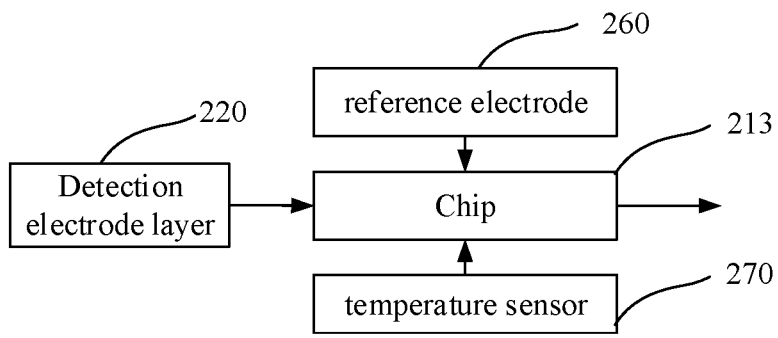
FIG. 12 is a schematic structural diagram of a capacitance detection apparatus having a reference electrode and a temperature sensor according to an embodiment of the present application.

FIG. 12 is a schematic structural diagram of a capacitance detection apparatus having a reference electrode and a temperature sensor according to an embodiment of the present application.

As shown in FIG. 12, in some embodiments of the present application, the capacitance detection apparatus 200 may further include:

a reference electrode 260 configured to compensate for temperature drift of the detection electrode layer 220 and/or a temperature sensor 270 configured to detect temperature.

The reference electrode 260 is electrically connected to the chip 213, the temperature sensor 270 is electrically connected to the reference electrode 260 or/and the chip 213, and the temperature sensor 270 is configured to trigger the reference electrode 260 to compensate for the at least one capacitance detection signal, and the chip 213 is configured to obtain the at least one capacitance detection signal and a compensation signal, and output a signal for indicating a detection result.

The reference electrode 260 may be an electrode layer formed by a differential electrode. The temperature sensor 270 may be integrated on the chip 213, or may be an external sensor, which is not specifically limited in the present application.

For example, the temperature sensor 270 is configured to obtain (for example, detect) a parameter value of an external factor, and the chip 213 may control the reference electrode 260 to generate the compensation signal according to the parameter value of the external factor.

The compensation signal output by the reference electrode 260 may be used to compensate for the temperature drift of the detection electrode layer 220. The temperature sensor 270 can be configured to detect temperature actively, and the temperature detected by the temperature sensor 270 is used to trigger the reference electrode 260 or the chip 213 to compensate for the at least one capacitance detection signal, so that the chip 213 calculates temperature drift deviation based on the at least one capacitance detection signal, the signal output by the reference electrode 260, and a temperature drift suppression algorithm to compensate for the at least one capacitance detection signal, thereby reducing external interference on the capacitance detection apparatus and improving accuracy of the capacitance signal detected by the capacitance detection apparatus.

For example, the temperature detected by the temperature sensor 270 is output by the reference electrode 260 triggered by a trigger circuit of the reference electrode 260 or the chip 213, which is used to compensate for a signal of the at least one capacitance detection signal. For another example, the temperature detected by the temperature sensor 270 triggers the chip 213 to generate a signal for compensating for the at least one capacitance detection signal.

Equivalently, the capacitance detection apparatus 200 is enabled to have extremely strong temperature drift suppression characteristics. Compared with the traditional capacitance detection solution, the present solution does not require a complicated peripheral circuit design, which can improve environmental adaptability of the capacitance detection apparatus 200 and reduce system costs.

It should be understood that the embodiment of the present application does not limit the specific arrangement of the reference electrode 260 and the temperature sensor 270.

FIGS. 13 to 17 are examples of structures of a capacitance detection apparatus having a reference electrode and/or a temperature sensor.

Figure 13:
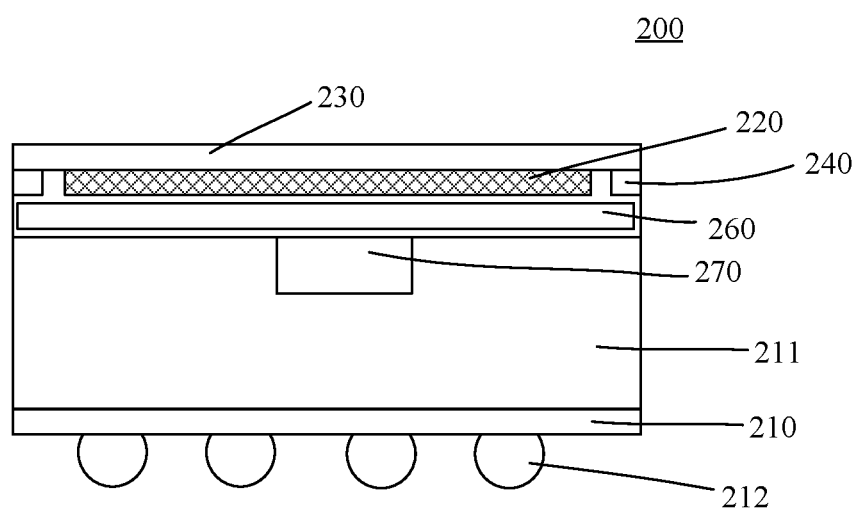
FIGS. 13 to 17 are examples of specific structures of a capacitance detection apparatus having a reference electrode and/or a temperature sensor.

As shown in FIG. 13, in some embodiments of the present application, the capacitance detection apparatus 200 may include a shielding electrode layer 240, a reference electrode 260 and a temperature sensor 270, where the temperature sensor 270 is disposed in the circuit layer 211, the reference electrode 260 is disposed between the circuit layer 211 and the detection electrode layer 220, and the shielding electrode layer 240 and the detection electrode layer 220 are located in the same plane.

In other alternative embodiments, the capacitance detection apparatus shown in FIG. 13 may be simply modified, which is not specifically limited in the embodiment of the present application.

Figure 14:
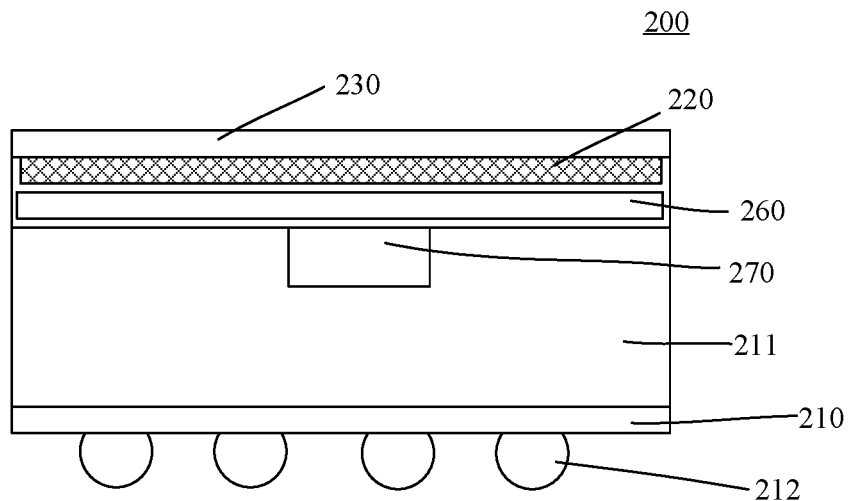
Figure 15:
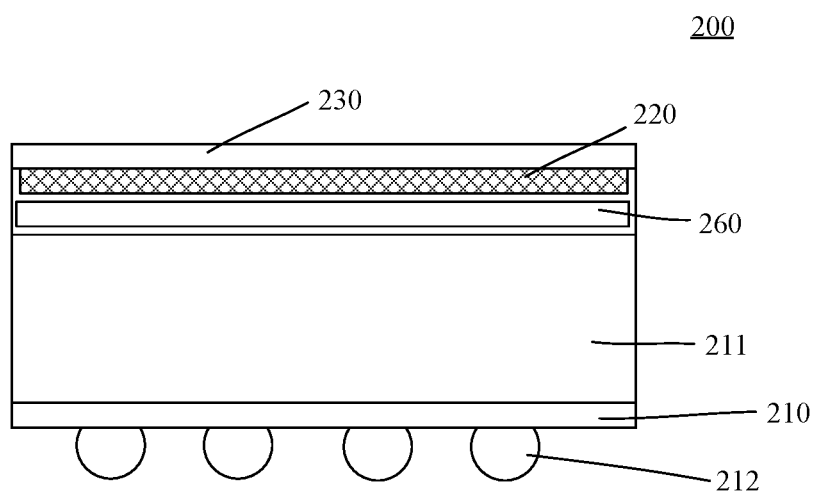
Figure 16:
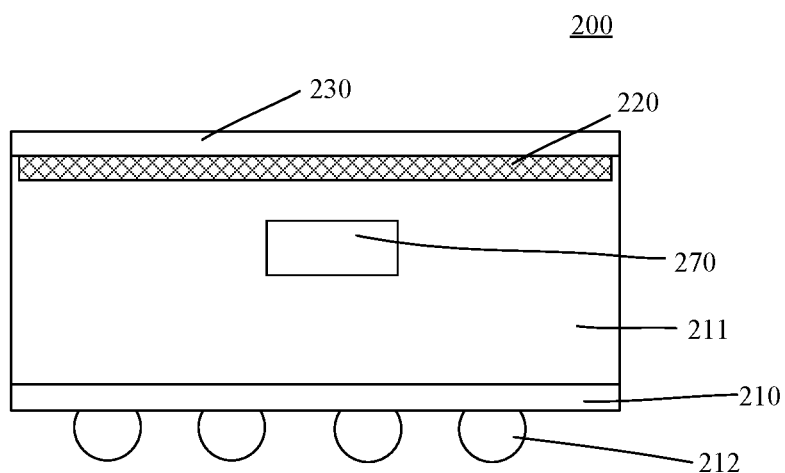
Figure 17:
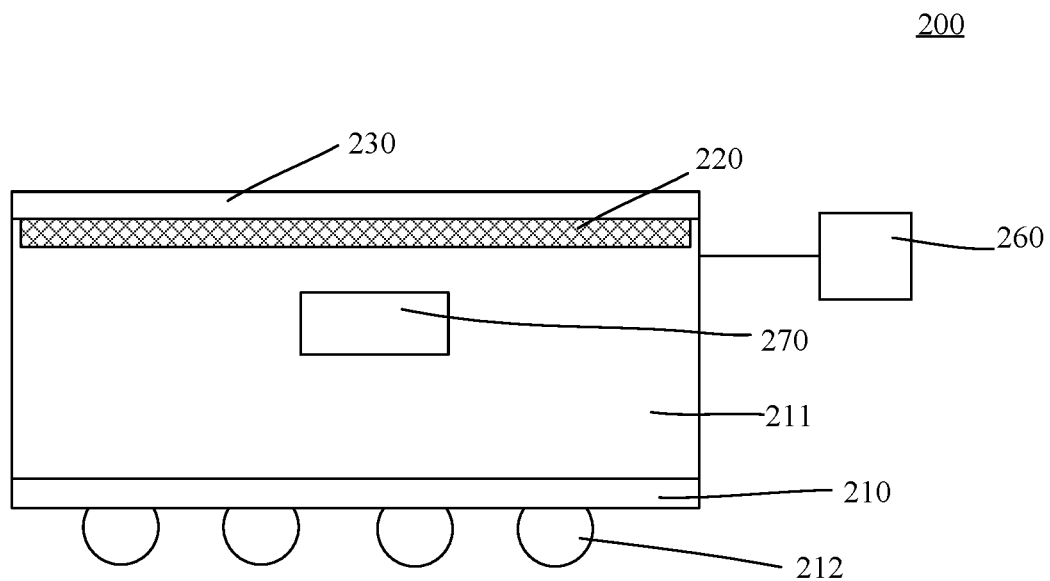

For example, as shown in FIG. 14, the capacitance detection apparatus 200 may not include the shielding electrode layer 240. For another example, as shown in FIG. 15, the capacitance detection apparatus 200 may not include the temperature sensor 270. For another example, as shown in FIG. 16, the capacitance detection apparatus may not include the reference electrode 260. For another example, as shown in FIG. 17, the reference electrode 260 may be used as an external component of the capacitance detection apparatus 200, and the reference electrode 260 may be connected to the circuit layer 211 of the capacitance detection apparatus 200.

In some embodiments of the present application, a connecting portion is provided at one end of the capacitance detection apparatus 200, and the connecting portion may be configured to be connected to an external electrode provided on the outside of the capacitance detection apparatus in the electronic device. Optionally, the external electrode is configured to output an external detection signal, and detection accuracy of the external electrode is greater than or equal to detection accuracy of any one of the at least one detection electrode. Optionally, a signal output by the external electrode is used for at least one of: wearing detection, in-box detection, proximity detection, human-computer interaction detection, or pressure detection. By matching the external electrode with the detection electrode layer, not only can multiple detection functions be realized at the same time, but also various application scenarios can be applied. Accordingly, practicability of the electronic device can be improved.

Figure 18:
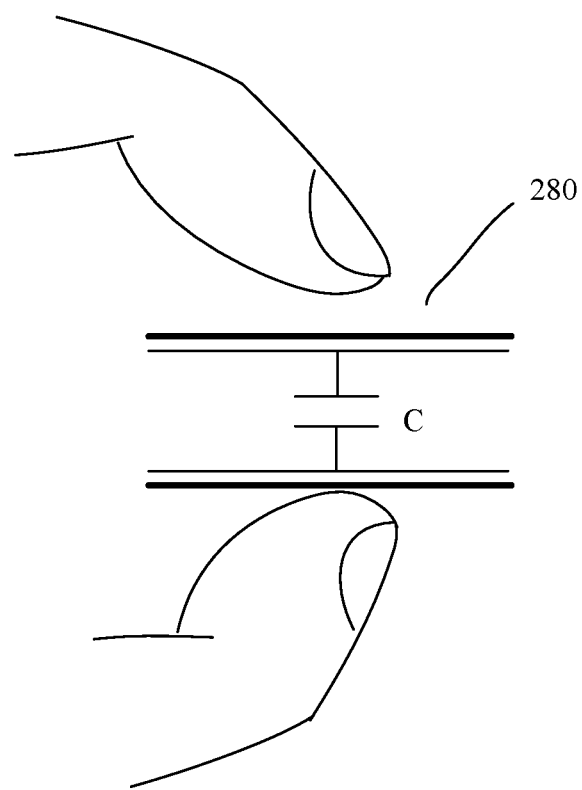
FIG. 18 is a schematic diagram of a capacitance value of a capacitive pressure sensor when the capacitive pressure sensor is not pressed according to an embodiment of the present application.

FIG. 18 is a schematic diagram of a capacitance value of a capacitive pressure sensor when the capacitive pressure sensor is not pressed according to an embodiment of the present application.

In some embodiments of the present application, the external electrode may be a pressure sensor. For example, as shown in FIG. 18, the external electrode may be a capacitive pressure sensor 280.

Of course, in other alternative embodiments, the external electrode may also be other types of sensors, which is not specifically limited in the present application.

In other words, the external electrode may also be configured to perform at least one of: wearing detection, in-box detection, proximity detection, human-computer interaction detection, or pressure detection. For ease of description, the following is described by an example that the external electrode is configured for pressure detection.

By comparing a capacitance value of the capacitive pressure sensor 280 when a user does not press (or touch) the capacitive pressure sensor 280 with a capacitance value of the capacitive pressure sensor 280 after the user presses the capacitive pressure sensor 280, pressure detection can be realized.

Figure 19:
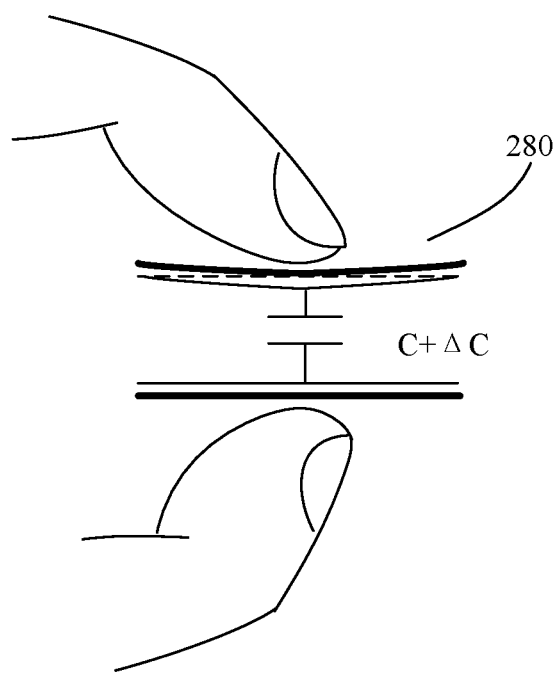
FIG. 19 is a schematic diagram of a capacitance value of a capacitive pressure sensor when the capacitive pressure sensor is pressed according to an embodiment of the present application.

FIG. 19 is a schematic diagram of a capacitance value of a capacitive pressure sensor when the capacitive pressure sensor is pressed according to an embodiment of the present application.

For example, as shown in FIG. 18, when a user does not press (or touch) the capacitive pressure sensor 280, a capacitance value of the capacitive pressure sensor 280 may be C. As shown in FIG. 19, after a user presses the capacitive pressure sensor 280, a capacitance value of the capacitive pressure sensor 280 is C+$\Delta$C, and the capacitance detection apparatus may perform the following pressure detection through $\Delta$C.

Figure 20:
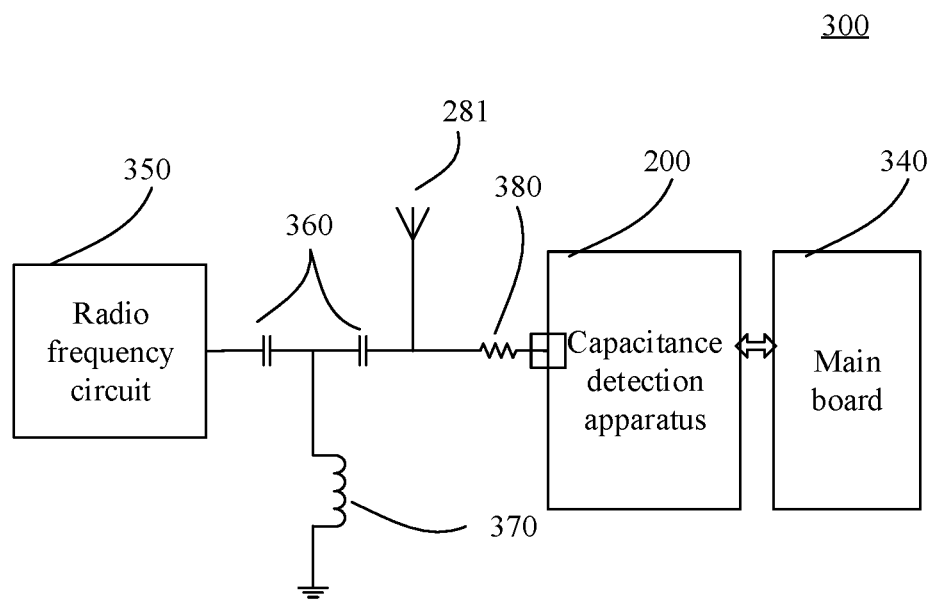
FIG. 20 is an example of a specific structure of an electronic device according to an embodiment of the present application.

FIG. 20 is an example of a specific structure of an electronic device 300 according to an embodiment of the present application.

As shown in FIG. 20, in some embodiments of the present application, the electronic device 300 may include a capacitance detection apparatus 200 and a main board 340, where the capacitance detection apparatus 200 is connected to the main board 340 in the electronic device 300. Optionally, the main board 340 may be a processor or a main board of the electronic device 300. The electronic device 300 may also include an antenna 281. Optionally, the antenna may be multiplexed as an external electrode.

In other words, the external electrode of the electronic device 300 is the antenna 281 of the electronic device 300. A signal output by the external electrode is used for at least one of: wearing detection, in-box detection, proximity detection, human-computer interaction detection, or pressure detection.

The antenna 281 in the electronic device is multiplexed as the external electrode, which is equivalent to that the number of devices in the capacitance detection apparatus 200 is reduced while an external electrode function and an antenna function are ensured, and can effectively reduce cost and occupation space of the capacitance detection apparatus 200.

In addition, multiplexing the antenna 281 as the external electrode of the capacitance detection apparatus 200 can avoid the problem of interference between positions of the antenna 281 and the external electrode. Accordingly, antenna efficiency and external detection performance of the electronic device 300 can be ensured.

Of course, alternatively, the external electrode may also be a touch electrode different from the antenna 281.

As an example, the electronic device 300 may further include a radio frequency (RF) filter, and electromagnetic interference (EMI) of the radio frequency filter is less than or equal to a preset threshold, so that the antenna 281 of the electronic device 300 can be multiplexed as the external electrode.

As shown in FIG. 20, in some embodiments of the present application, the electronic device 300 may further include a radio frequency circuit 350 and a radio frequency matching circuit 360. The radio frequency circuit 350 is connected to the antenna 281 through the radio frequency matching circuit 360, the antenna 281 is connected to the capacitance detection apparatus 200, and the radio frequency matching circuit 360 is connected to the ground through an inductor 370, so that the antenna 281 is multiplexed as the external electrode of the capacitance detection apparatus, and antenna performance is not affected. The radio frequency circuit 350 may be a circuit with a radio frequency signal processing function. Optionally, the radio frequency matching circuit 360 may be two capacitors connected in series, and the radio frequency circuit 350 may be connected to the inductor 370 through one of the two capacitors connected in series. Optionally, the antenna 281 may be connected to the capacitance detection apparatus 200 through a matching resistor 380.

Figure 21:
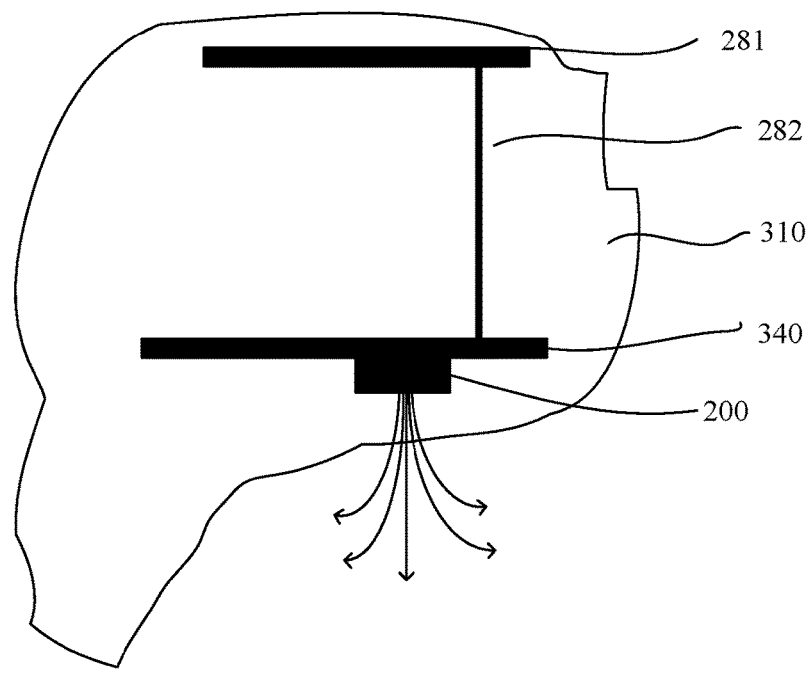
FIG. 21 is a schematic structural diagram of an earphone having a capacitance detection apparatus according to an embodiment of the present application.

FIG. 21 is a schematic structural diagram of an electronic device 300 having a capacitance detection apparatus according to an embodiment of the present application.

As shown in FIG. 21, in some embodiments of the present application, the electronic device 300 may be an earphone. The antenna 281 may be connected to a main board 340 of the earphone through a connecting wire 282, the main board 340 may be fixedly disposed on a housing 310 of the earphone, and the capacitance detection apparatus 200 described above may be directly connected and fixed to the main board 340 of the capacitance detection apparatus.

Figure 22:
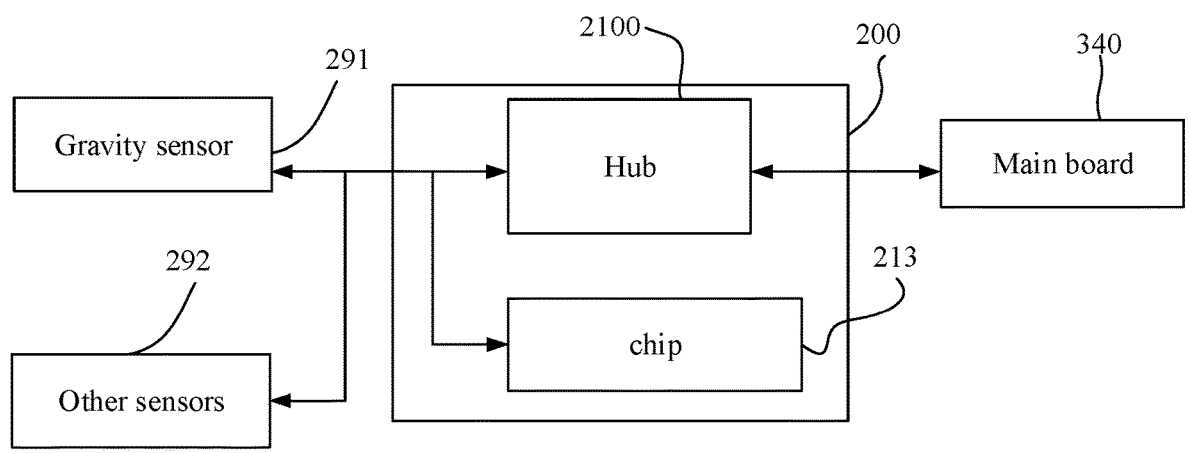
FIG. 22 is a schematic structural diagram of an electronic device having a hub according to an embodiment of the present application.

FIG. 22 is a schematic structural diagram of an electronic device 300 having a hub according to an embodiment of the present application.

As shown in FIG. 22, in some embodiments of the present application, the capacitance detection apparatus 200 further includes a hub 2100, and the chip 213 is connected to the main board 340 of the electronic device through the hub 2100 to realize communication or electrical interconnection between the capacitance detection apparatus 200 and the electronic device 300.

As shown in FIG. 22, in some embodiments of the present application, the electronic device 300 may further include a gravity sensor 291 and other sensors 292. The gravity sensor 291, the other sensors 292, and the chip 213 may be connected to the main board 340 through the hub 2100. Optionally, the other sensors 292 include but are not limited to an acceleration sensor, a capacitive sensor, an optical sensor, and so on.

Through the hub 2100, the capacitance detection apparatus 200 can support calculation and processing of a signal from other sensors on the basis of a wearing detection function and a human-computer interaction function, and report a processing result to a processor. Accordingly, occupation of resources of the processor can be reduced, and system power consumption is further reduced.

In some embodiments of the present application, the capacitance detection apparatus 200 may further include an encoding and decoding circuit. The encoding and decoding circuit is connected to the at least one detection electrode, and the at least one detection electrode is configured to form a coupling capacitor with a coupling electrode at an opposite end, and the encoding and decoding circuit transmits an encoded signal to the opposite end or receives a signal to be decoded transmitted by the opposite end through the coupling capacitor.

By matching the encoding and decoding circuit with the at least one electrode, the electronic device where the capacitance detection apparatus is located can be enabled to communicate with the opposite end, and transmission efficiency and accuracy rate of the at least one capacitance detection signal can be ensured.

Further, the present application further provides an electronic device, including the capacitance detection apparatus 200 described above.

Figure 23:
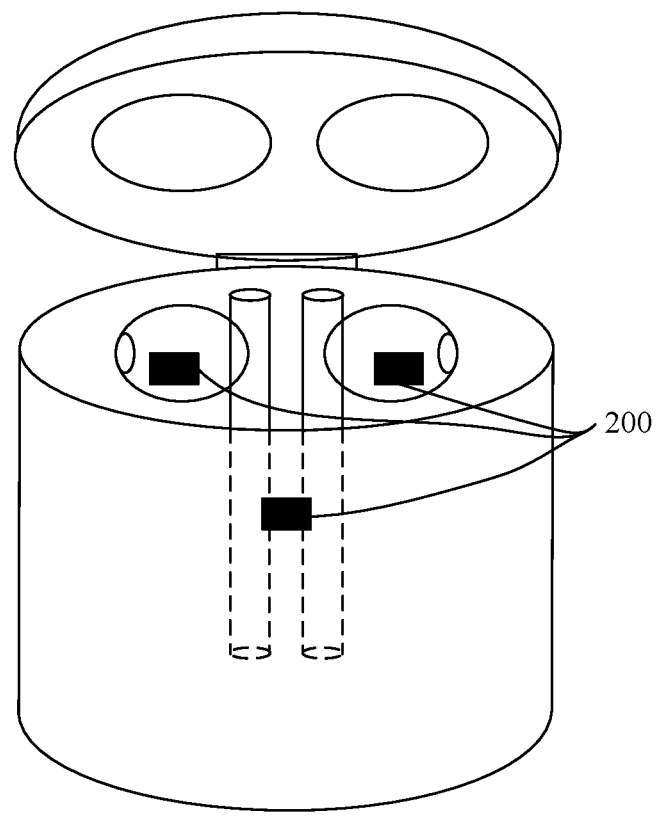
FIG. 23 is a schematic structural diagram of an earphone having a capacitance detection apparatus and an earphone box according to an embodiment of the present application.

FIG. 23 is a schematic structural diagram of a system 400 according to an embodiment of the present application.

As shown in FIG. 23, in some embodiments of the present application, the system 400 may include an earphone having the capacitance detection apparatus 200 described above and a charging box having the capacitance detection apparatus 200 described above. The capacitance detection apparatus 200 in the earphone and the capacitance detection apparatus 200 in the charging box can realize in-box detection and wireless communication in a capacitive coupling manner.

Those of ordinary skill in the art may be aware that, units and algorithm steps of examples described with reference to the embodiments disclosed herein may be implemented by electronic hardware, or a combination of computer software and electronic hardware. Whether these functions are performed by hardware or software depends on specific applications and designed constraint conditions of the technical solutions. Persons skilled in the art may use different methods to implement the described functions for every particular application, but it should not be considered that such implementation goes beyond the scope of the present application.

In addition, functional units in the embodiments of the present application may be integrated into one processing unit, or each unit may exist alone physically, or two or more than two units may be integrated into one unit.

If the function is implemented in the form of a software functional unit and is sold or used as an independent product, the functional unit may be stored in a computer readable storage medium. Based on such understanding, the technical solutions of the present application substantially, or part of the present application making contribution to the prior art, or part of the technical solution may be embodied in the form of a software product, and the computer software product is stored in a storage medium, which includes several instructions for enabling a computer device (which may be a personal computer, a server, a network device, or the like) to execute all of or part of steps in the method of the embodiments of the present application. The foregoing storage medium includes: various media capable of storing program codes, such as a U disk, a mobile hard disk, a read-only memory (ROM), a random access memory (RAM), a disk, an optical disk or the like.

Described above are the specific implementation manners of the present application only, but the protection scope of the present application is not limited thereto, those skilled who are familiar with the art could readily think of variations or substitutions within the technical scope disclosed by the present application, and these variations or substitutions shall fall within the protection scope of the present appli-

What is claimed is:

1. A capacitance detection apparatus, wherein the capacitance detection apparatus is applied to an electronic device and comprises:
 a chip, wherein the chip is a diced chip or a chip to be packaged; and
 a detection electrode layer, wherein the detection electrode layer is integrally disposed with the chip and electrically connected to the chip, and the detection electrode layer is an electroplating layer disposed on a surface of the chip, the detection electrode layer comprises at least one detection electrode configured to form at least one capacitance detection channel, the at least one capacitance detection channel is respectively configured to output at least one capacitance detection signal, and the chip is configured to process the at least one capacitance detection signal;
 wherein the at least one capacitance detection signal is used for at least one of: wearing detection, in-box detection, proximity detection, touch detection or pressure detection, and
 wherein the capacitance detection apparatus further comprises:
  a shielding electrode layer configured to output a signal with same frequency, phase and amplitude as the at least one capacitance detection signal to form a shielding electric field,
  wherein the shielding electrode layer surrounds the detection electrode layer, and the shielding electric field is used to reduce curvature of an induction line in an induced electric field generated by the at least one detection electrode.

2. The capacitance detection apparatus according to claim 1, wherein the detection electrode layer is disposed inside a circuit layer of the chip or on a surface of the circuit layer.

3. The capacitance detection apparatus according to claim 1, wherein the capacitance detection apparatus further comprises:
 a packaging layer,
 wherein the packaging layer is configured to package the chip to form a capacitance detection module, and the detection electrode layer is disposed inside the packaging layer or on a surface of the packaging layer.

4. The capacitance detection apparatus according to claim 3, wherein the capacitance detection apparatus further comprises:
 a reference electrode configured to compensate for temperature drift of the detection electrode layer and/or a temperature sensor configured to detect temperature,
 wherein the reference electrode is electrically connected to the chip, the temperature sensor is electrically connected to the reference electrode or/and the chip, and the temperature sensor is configured to trigger the reference electrode to compensate for the at least one capacitance detection signal, and the chip is configured to obtain the at least one capacitance detection signal and a compensation signal, and output a signal for indicating a detection result.

5. The capacitance detection apparatus according to claim 1, wherein the detection electrode layer is connected to the chip through a conductive member.

6. The capacitance detection apparatus according to claim 1, wherein the shielding electrode layer and the detection electrode layer are located in the same plane.

7. The capacitance detection apparatus according to claim 1, wherein the capacitance detection apparatus further comprises:
 a reference electrode configured to compensate for temperature drift of the detection electrode layer and/or a temperature sensor configured to detect temperature,
 wherein the reference electrode is electrically connected to the chip, the temperature sensor is electrically connected to the reference electrode or/and the chip, and the temperature sensor is configured to trigger the reference electrode to compensate for the at least one capacitance detection signal, and the chip is configured to obtain the at least one capacitance detection signal and a compensation signal, and output a signal for indicating a detection result.

8. The capacitance detection apparatus according to claim 1, wherein a connecting portion is provided at one end of the capacitance detection apparatus, and the connecting portion is configured to be connected to an external electrode provided on an outside of the capacitance detection apparatus in the electronic device.

9. The capacitance detection apparatus according to claim 8, wherein a signal output by the external electrode is used for at least one of: wearing detection, in-box detection, proximity detection, human-computer interaction detection, or pressure detection.

10. The capacitance detection apparatus according to claim 1, wherein the capacitance detection apparatus further comprises:
 a hub,
 wherein the chip is connected to a processor of the electronic device through the hub to realize communication between the capacitance detection apparatus and the electronic device.

11. The capacitance detection apparatus according to claim 1, wherein the chip comprises a wafer and a circuit layer, and the detection electrode layer is electroplated to a surface of the wafer.

12. The capacitance detection apparatus according to claim 1, wherein the detection electrode layer is integrally disposed with the chip, which can ensure that a minimum distance between the capacitance detection apparatus and an object to be detected is greater than or equal to a preset threshold, and further, a detection accuracy of the at least one capacitance detection signal meets detection requirements of the capacitance detection apparatus.

13. An electronic device, comprising:
 a capacitance detection apparatus applied to an electronic device, wherein the capacitance detection apparatus comprises:
 a chip, wherein the chip is a diced chip or a chip to be packaged; and
 a detection electrode layer, wherein the detection electrode layer is integrally disposed with the chip and electrically connected to the chip, and the detection electrode layer is an electroplating layer disposed on the surface of the chip, the detection electrode layer comprises at least one detection electrode configured to form at least one capacitance detection channel, the at least one capacitance detection channel is respectively configured to output at least one capacitance detection signal, and the chip is configured to process the at least one capacitance detection signal;
 wherein an external electrode of the electronic device is an antenna of the electronic device, and a signal output by the external electrode is used for at least one of:

wearing detection, in-box detection, proximity detection, touch detection or pressure detection, and wherein the capacitance detection apparatus further comprises:

a shielding electrode layer configured to output a signal with same frequency, phase and amplitude as the at least one capacitance detection signal to form a shielding electric field, wherein the shielding electrode layer surrounds the detection electrode layer, and the shielding electric field is used to reduce curvature of an induction line in an induced electric field generated by the at least one detection electrode.

14. The electronic device according to claim 13, wherein the electronic device is an earphone, and the earphone further comprises:

a housing and a main board disposed in the housing, wherein the capacitance detection apparatus is disposed on an inner wall of the housing or the capacitance detection apparatus is disposed on the main board.

15. The electronic device according to claim 14, wherein the capacitance detection apparatus is fixedly connected to an inner side surface of the housing or the main board through an adhesive layer.

* * * * *